(12) United States Patent
Huang et al.

(10) Patent No.: US 9,105,634 B2
(45) Date of Patent: Aug. 11, 2015

(54) VOIDS IN INTERCONNECT STRUCTURES AND METHODS FOR FORMING THE SAME

(75) Inventors: Jiun-Jie Huang, Kaohsiung (TW); Ling-Sung Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 125 days.

(21) Appl. No.: 13/539,121

(22) Filed: Jun. 29, 2012

(65) Prior Publication Data
US 2014/0001597 A1  Jan. 2, 2014

(51) Int. Cl.
| | |
|---|---|
| *H01L 21/4763* | (2006.01) |
| *H01L 23/522* | (2006.01) |
| *H01L 23/532* | (2006.01) |
| *H01L 21/768* | (2006.01) |
| *H01L 49/02* | (2006.01) |

(52) U.S. Cl.
CPC ........ *H01L 23/5222* (2013.01); *H01L 21/7682* (2013.01); *H01L 23/5223* (2013.01); *H01L 23/5329* (2013.01); *H01L 23/53295* (2013.01); *H01L 28/88* (2013.01); *H01L 28/90* (2013.01); *H01L 23/5227* (2013.01); *H01L 28/10* (2013.01); *H01L 28/20* (2013.01)

(58) Field of Classification Search
CPC .................................. H01L 28/40; H01L 21/00
USPC .................... 257/531, 782, E23.01, E21.586; 438/619, 675
See application file for complete search history.

(56) References Cited

U.S. PATENT DOCUMENTS

| | | | | |
|---|---|---|---|---|
| 5,461,003 | A * | 10/1995 | Havemann et al. | 438/666 |
| 5,512,775 | A * | 4/1996 | Cho | 257/522 |
| 5,847,439 | A * | 12/1998 | Reinberg | 257/522 |
| 5,923,074 | A * | 7/1999 | Jeng | 257/522 |
| 5,949,143 | A * | 9/1999 | Bang | 257/758 |
| 6,057,226 | A * | 5/2000 | Wong | 438/623 |
| 6,159,840 | A * | 12/2000 | Wang | 438/618 |
| 6,204,165 | B1 * | 3/2001 | Ghoshal | 438/619 |
| 6,211,561 | B1 * | 4/2001 | Zhao | 257/522 |
| 6,245,658 | B1 * | 6/2001 | Buynoski | 438/619 |
| 6,297,554 | B1 * | 10/2001 | Lin | 257/752 |
| 6,437,418 | B1 * | 8/2002 | Ferrari et al. | 257/531 |
| 6,509,623 | B2 * | 1/2003 | Zhao | 257/522 |
| 6,784,091 | B1 * | 8/2004 | Nuetzel et al. | 438/618 |
| 6,984,577 | B1 * | 1/2006 | Zhao et al. | 438/619 |
| 7,056,822 | B1 * | 6/2006 | Zhao | 438/619 |
| 7,172,980 | B2 * | 2/2007 | Torres et al. | 438/783 |
| 7,229,909 | B2 * | 6/2007 | Furukawa et al. | 438/622 |
| 7,238,604 | B2 * | 7/2007 | Kloster et al. | 438/619 |
| 7,301,107 | B2 * | 11/2007 | Karthikeyan et al. | 174/262 |
| 7,425,501 | B2 * | 9/2008 | Gotkis et al. | 438/622 |
| 8,049,297 | B2 * | 11/2011 | Tischler | 257/510 |
| 8,344,474 | B2 * | 1/2013 | Seidel et al. | 257/522 |
| 2005/0037604 | A1 * | 2/2005 | Babich et al. | 438/619 |
| 2005/0167838 | A1 * | 8/2005 | Edelstein et al. | 257/758 |

(Continued)

OTHER PUBLICATIONS

Tsu et al., "Leakage and breakdown reliability issues associated with low-k dielectrics in a dual-damascene Cu process," Reliability Physics Symposium, 2000. Proceedings. 38th Annual 2000 IEEE International, pp. 348-353.*

*Primary Examiner* — Mohammad Islam
*Assistant Examiner* — Ankush Singal
(74) *Attorney, Agent, or Firm* — Slater & Matsil, L.L.P.

(57) ABSTRACT

A device includes a dielectric layer, a passive device including a portion in the dielectric layer, and a plurality of voids in the dielectric layer and encircling the passive device.

20 Claims, 13 Drawing Sheets

(56) References Cited

U.S. PATENT DOCUMENTS

| | | | |
|---|---|---|---|
| 2005/0272341 A1* | 12/2005 | Colburn et al. | 445/23 |
| 2006/0177990 A1* | 8/2006 | Beyer et al. | 438/421 |
| 2007/0018331 A1* | 1/2007 | Chen | 257/774 |
| 2007/0184647 A1* | 8/2007 | Furukawa et al. | 438/622 |
| 2008/0014739 A1* | 1/2008 | Matz et al. | 438/622 |
| 2008/0020488 A1* | 1/2008 | Clevenger et al. | 438/3 |
| 2008/0182403 A1* | 7/2008 | Noori et al. | 438/618 |
| 2008/0185722 A1* | 8/2008 | Liu et al. | 257/751 |
| 2009/0093132 A1* | 4/2009 | Xu et al. | 438/780 |
| 2009/0130863 A1* | 5/2009 | Toma et al. | 438/795 |
| 2009/0243045 A1* | 10/2009 | Pagaila et al. | 257/621 |
| 2010/0206842 A1* | 8/2010 | Gu | 216/41 |
| 2011/0101492 A1* | 5/2011 | Won et al. | 257/522 |
| 2011/0156261 A1* | 6/2011 | Kapusta et al. | 257/773 |
| 2011/0260323 A1* | 10/2011 | Yang et al. | 257/751 |
| 2012/0112361 A1* | 5/2012 | Han et al. | 257/774 |
| 2012/0153490 A1* | 6/2012 | Vannier | 257/773 |
| 2012/0193702 A1* | 8/2012 | Machida et al. | 257/329 |
| 2012/0280366 A1* | 11/2012 | Kamgaing et al. | 257/621 |
| 2013/0087930 A1* | 4/2013 | Meinhold | 257/782 |

* cited by examiner

VOIDS IN INTERCONNECT STRUCTURES AND METHODS FOR FORMING THE SAME

BACKGROUND

Passive devices such as inductors, transformers, transmission lines, or the like are commonly used in Radio Frequency (RF) applications. Due to the short wavelengths of the RF signals, the RF devices, which have relatively large sizes compared to the small wavelengths, have significant cross-talks with each other, and with nearby conductive components. The performance of the RF devices is thus affected significantly by the nearby conductive features and devices.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Voids that surround a passive device and the method of forming the same are provided in accordance with various exemplary embodiments. The intermediate stages of forming the voids and the passive device are illustrated. The variations of the embodiments are discussed. Throughout the various views and illustrative embodiments, like reference numbers are used to designate like elements.

Figure 1:
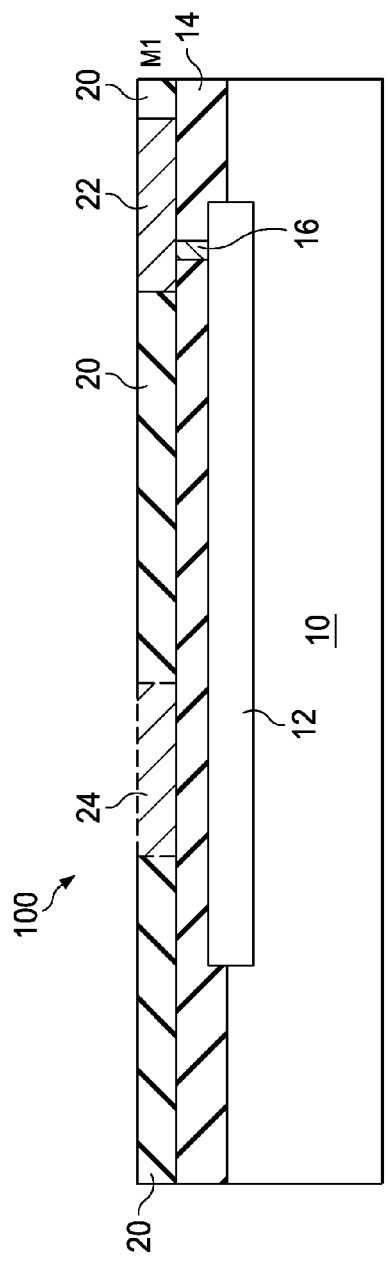
FIGS. 1 through 13 are cross-sectional views of intermediate stages in the manufacturing of voids adjacent to a passive device in accordance with some exemplary embodiments.

FIG. 1 illustrates wafer 100, which includes semiconductor substrate 10. Semiconductor substrate 10 may be formed of silicon, germanium, silicon germanium, III-V compound semiconductor, or the like. Active and passive devices 12, such as transistors, capacitors, resistors, and the like, may be formed adjacent to the top surface of semiconductor substrate 10.

FIG. 1 also illustrates the formation of Inter-Layer Dielectric (ILD) 14 and contact plug 16 in ILD 14. ILD 14 may be formed of Phospho-Silicate Glass (PSG), Boro-Silicate Glass (BSG), Boron-Doped Phospho-Silicate Glass (BPSG), Tetraethyl Orthosilicate (TEOS) oxide, or the like. Contact plug 16 may comprise tungsten. Dielectric layer 20 is formed over ILD 14. Dielectric layer 20 is alternatively referred to as an Inter-Metal Dielectric (IMD) layer. In some embodiments, IMD layer 20 comprises a low-k dielectric material, which has a dielectric constant (k value) lower than 3.9. The k value of IMD layer 20 may also be lower than about 3.0, or lower than about 2.5.

Metal line 22 is formed in IMD layer 20. In some embodiments, metal line 24, which may be a part of passive device 102 (FIGS. 13 through 15), is also formed in IMD layer 20. In alternative embodiments, passive device 102 does not extend into IMD layer 20. Throughout the description, the metal lines in an IMD layer are collectively referred to as a metal layer. Accordingly, metal lines 22 and 24 are in bottom metal layer M1.

Figure 2:
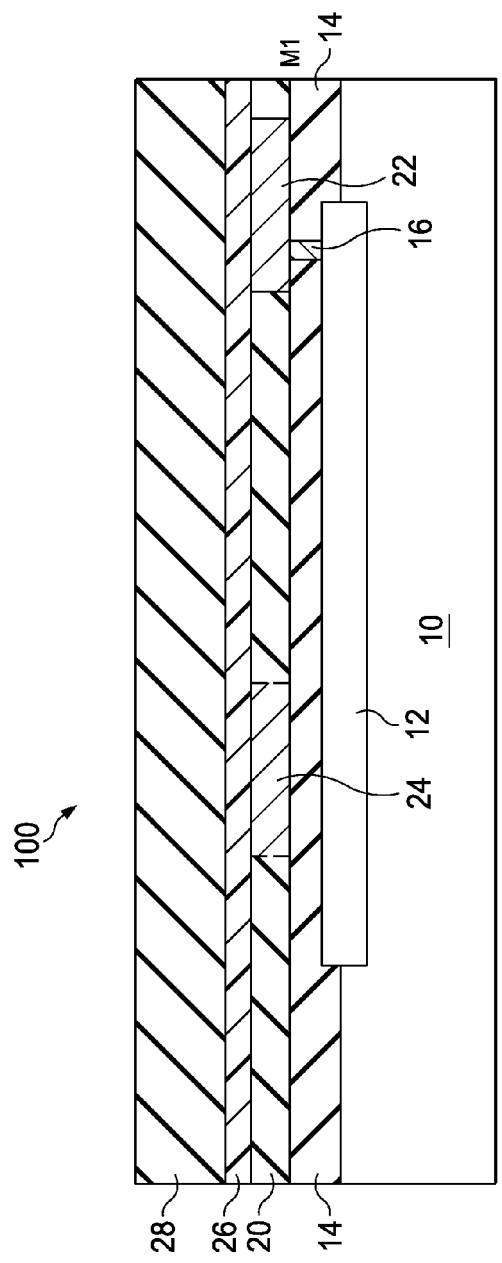

Referring to FIG. 2, Etch stop layer (ESL) 26 is formed over dielectric layer 20 and conductive lines 22 and 24. ESL 26 may include a nitride, a silicon and carbon based dielectric, a carbon-doped oxide, or the like. ESL 26 may have a k value close to or greater than about 3.9. An exemplary formation method includes Plasma Enhanced Chemical Vapor Deposition (PECVD). However, other commonly used methods such as High-Density Plasma CVD (HDPCVD), Atomic Layer CVD (ALCVD), and the like can also be used. Next, IMD layer 28 is formed. In some embodiments, IMD layer 28 has a dielectric constant (k value) lower than about 3.5, hence is referred to as low-k IMD layer 28 throughout the description. The k value of low-k IMD layer 28 may also be lower than about 2.8. In some embodiments, low-k IMD layer 28 includes oxygen, silicon, nitrogen, and the like. The exemplary materials include carbon-containing materials, organosilicate glass, porogen-containing materials, and the like. Pores may be formed in low-k IMD layer 28 for lowering its k value. Low-k IMD layer 28 may be deposited using a CVD method such as PECVD, although other deposition methods such as LPCVD, ALCVD, and spin-on can also be used.

Figure 3:
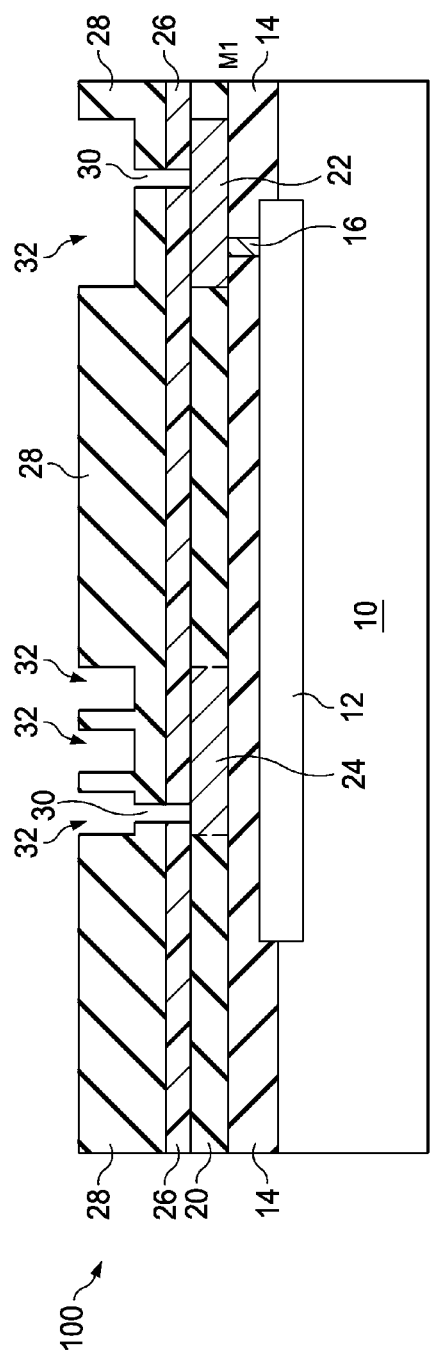
Figure 4:
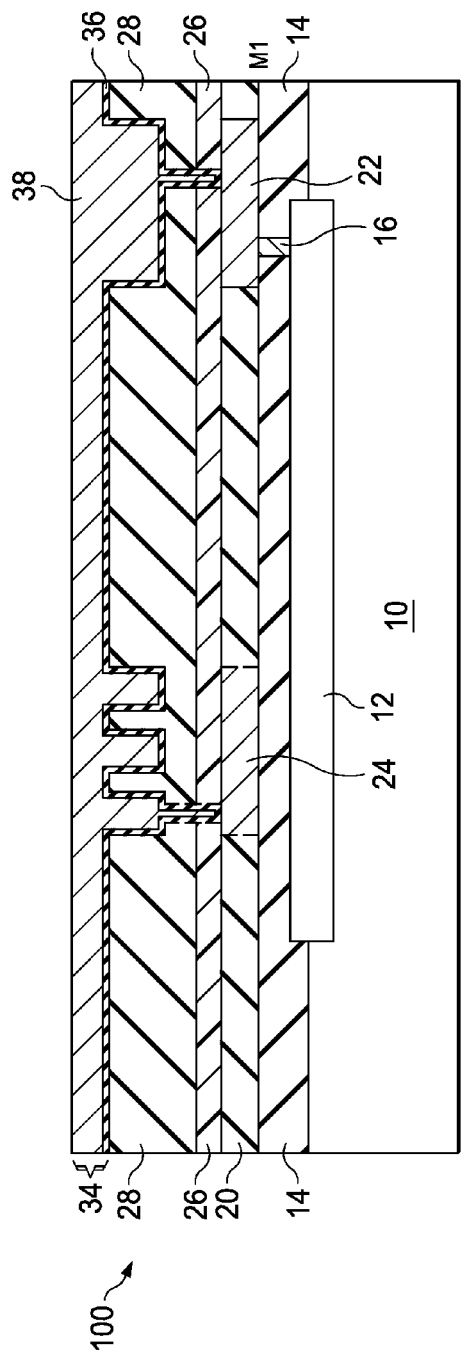
Figure 5:
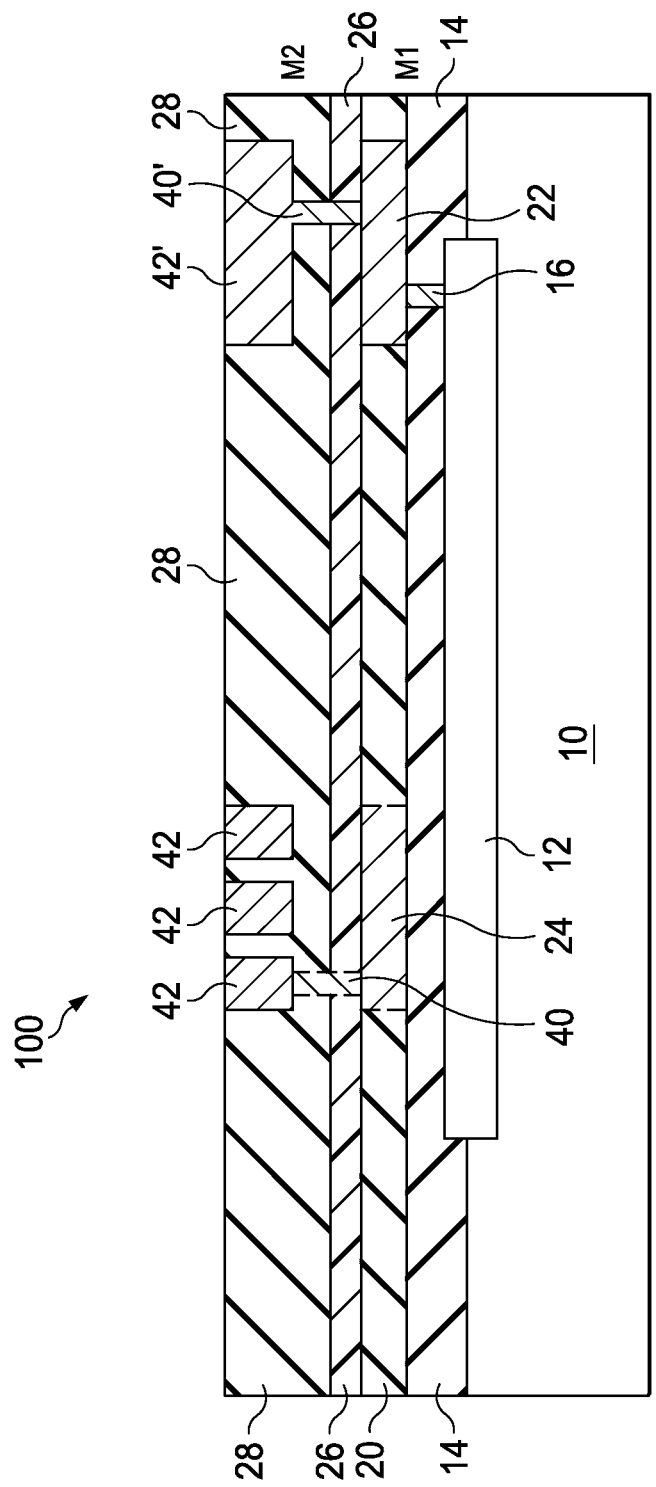

A dual damascene process is shown in FIGS. 3 through 5. FIG. 3 illustrates the formation of via openings 30 and trench openings 32 in low-k IMD layer 28. Photo resists (not shown) are first formed and patterned over low-k IMD layer 28 to aid the formation of via openings 30 and trench openings 32. In some embodiment, an anisotropic etch is performed to etch through low-k IMD layer 28 and stops at ESL 26, thereby forming via openings 30. Trench openings 32 are also formed through etching. The etching time is controlled so that the etching of trench openings 32 stops at a desirable depth. ESL 26 is then etched through via opening 30, exposing underlying conductive lines 22 and 24, if any. In alternative embodiments wherein metal line 24 is not formed, the via opening 30 that is illustrated as overlying metal lines 24 may not be formed.

FIG. 4 illustrates the filling of conductive material 34 in via openings 30 and trench openings 32. In some embodiments, the filling process includes blanket depositing diffusion barrier layer 36, forming a seed layer (not shown) over diffusion barrier layer 36, and performing a plating step to form copper-containing material 38, until the top surface of copper-containing material 38 is higher than the top surface of low-k IMD layer 28. Diffusion barrier layer 36 may include titanium, titanium nitride, tantalum, tantalum nitride, or other alternatives.

Next, as shown in FIG. 5, a Chemical Mechanical Polish (CMP) is performed to remove the excess portions of copper-containing material 38 and diffusion barrier layer 36 that are over low-k IMD layer 28, leaving metal line 42 and vias 40 in IMD layer 28. Metal line 42 and via 40 are parts of the resulting passive device 102. In addition, metal line 42' and vias 40' are also formed in IMD layer 28, and are used for interconnection. Throughout the description, all metal lines 42 and 42' in IMD layer 28 are collectively referred to metal layer M2.

Figure 6:
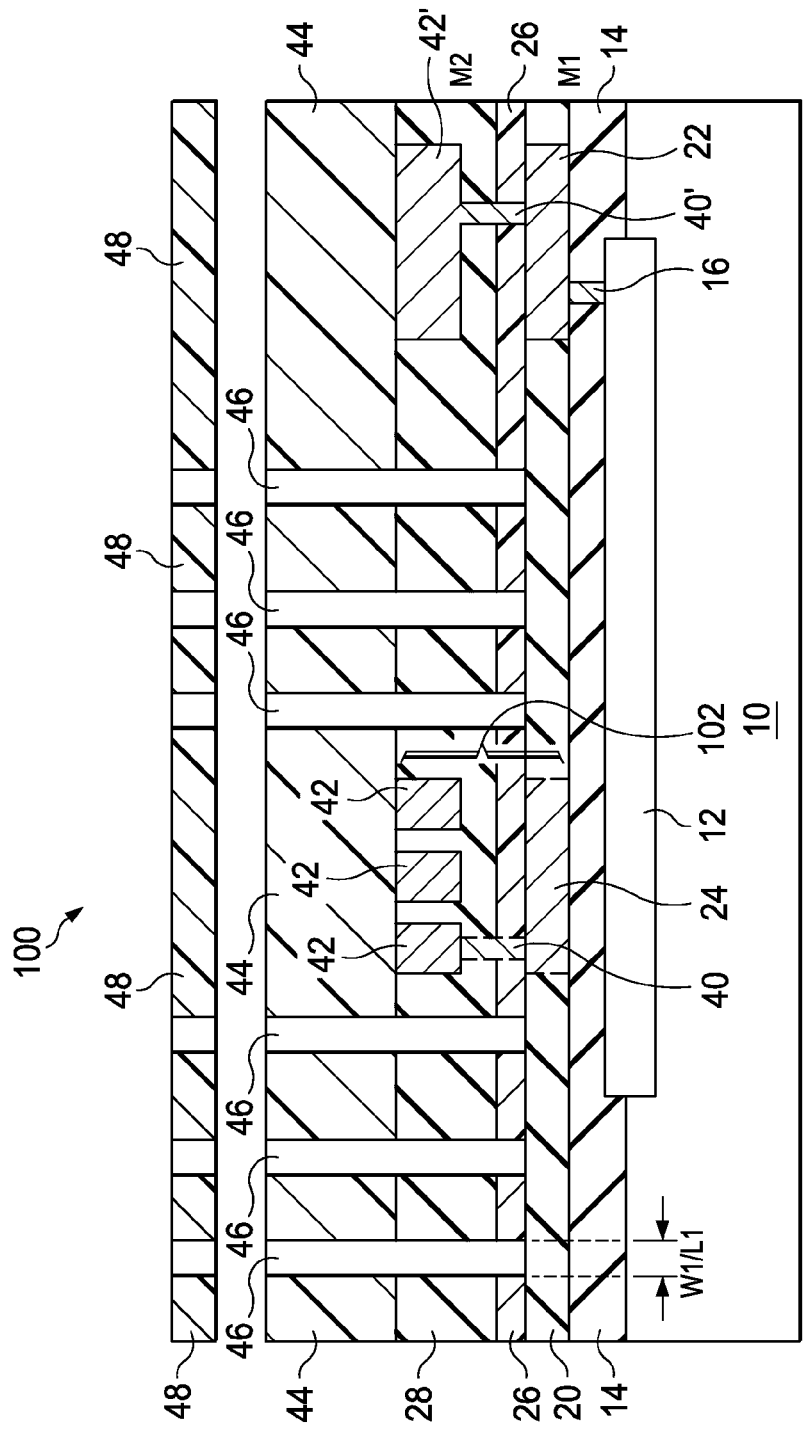
Figure 15:
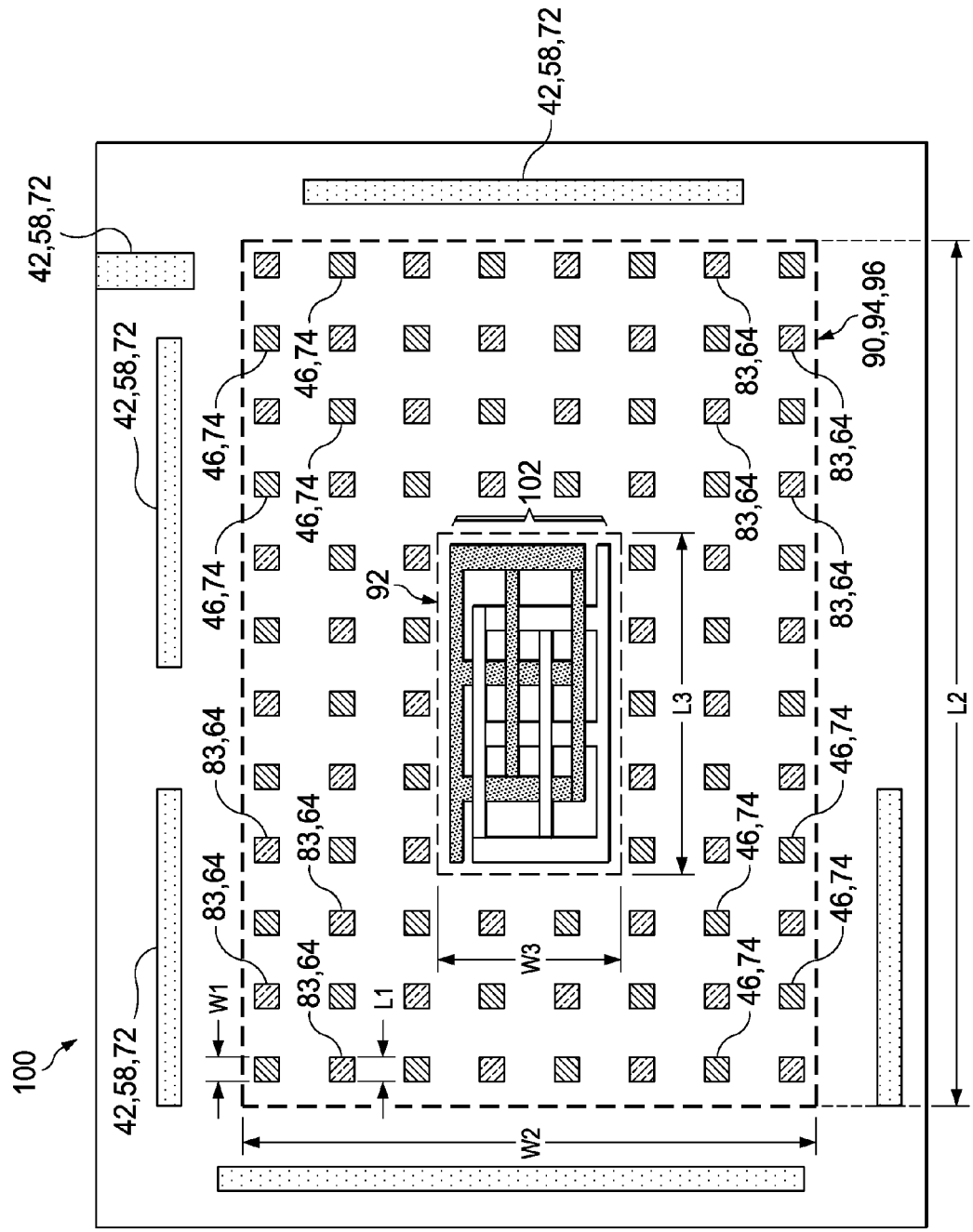
FIG. 15 illustrates a top view of the structure in FIG. 13.

FIG. 6 illustrates the formation of openings 46 in low-k IMD layer 28 and ESL 26. In some embodiments, photo resist 44 is applied, and is then exposed and developed. In the exposing of photo resist 44, lithography mask 48 is used, wherein lithography mask 48 includes opaque portions for blocking the light that is used for exposing, and transparent portions for allowing the light to pass through. In the formation of openings 46, low-k IMD layer 28 is etched first in a first etching step, with ESL 26 acting as the etch stop layer in the etching of low-k IMD layer 28. Next, using same photo resist 44 as the etching mask, ESL 26 is etched in a second etching step, with the underlying IMD layer 20 acting as the etch stop layer. The first and the second etching steps may use different etching gases and different process conditions. Accordingly, openings 46 penetrate through ESL 26 and reach the top surface of IMD layer 20. In alternative embodiments, the second etching step is skipped, and hence ESL 26 is not etched. Openings 46 have length L1 or width W1 between about 50 nm and about 400 nm in some embodiments. The top-view shapes (as shown in FIG. 15) of openings 46 may be squares, circles, or the like. Openings 46 are formed surrounding passive device 102.

Figure 7:
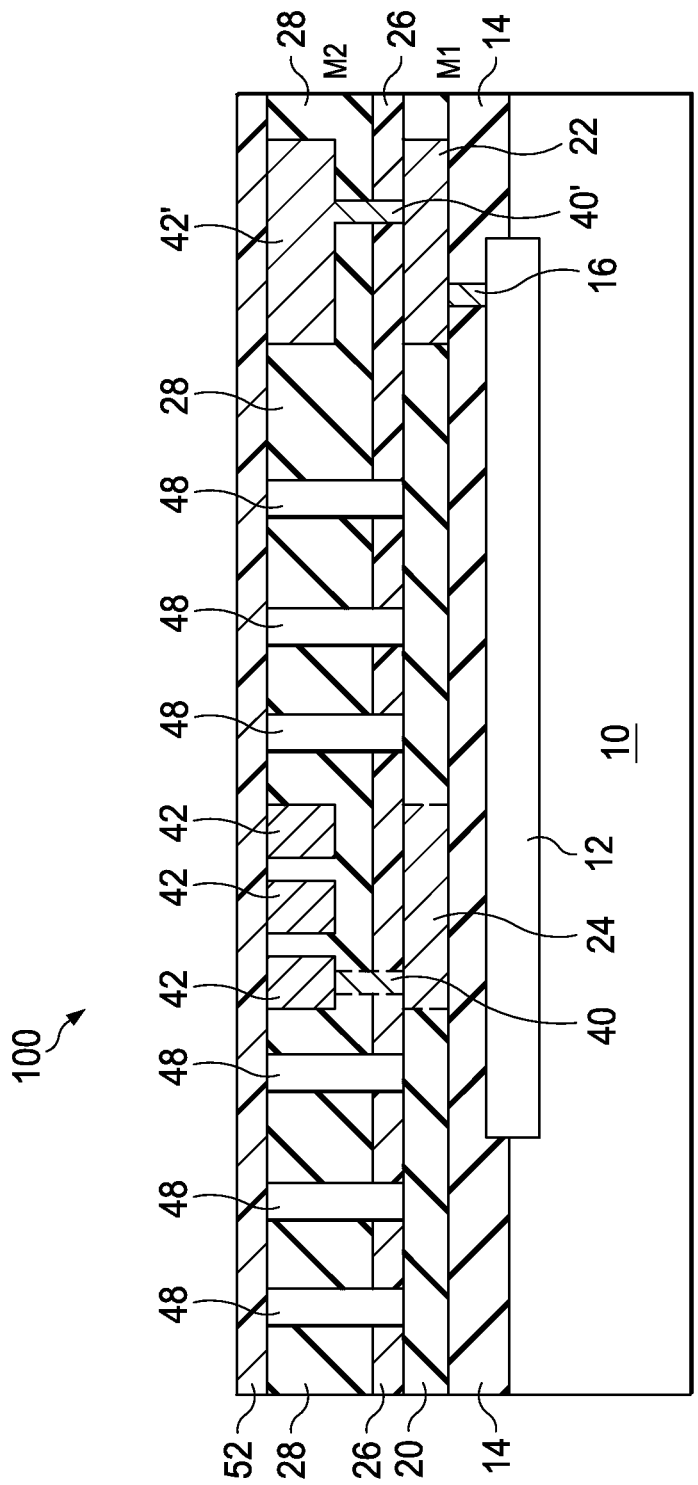

Next, as shown in FIG. 7, ESL 52 is formed over IMD layer 28. The material of ESL 52 may be selected from the same group of available materials for forming ESL 26. The formation methods may include PECVD, HDPCVD, or the like. The formation method of ESL 52 is also selected so that openings 46 are not filled substantially. Accordingly, openings 46 are sealed, and hence are referred to as voids 46 hereinafter. In subsequent processes, openings 46 may be filled with air, or may be vacuumed or partially vacuumed (with the internal pressure lower than one atmosphere).

Figure 8:
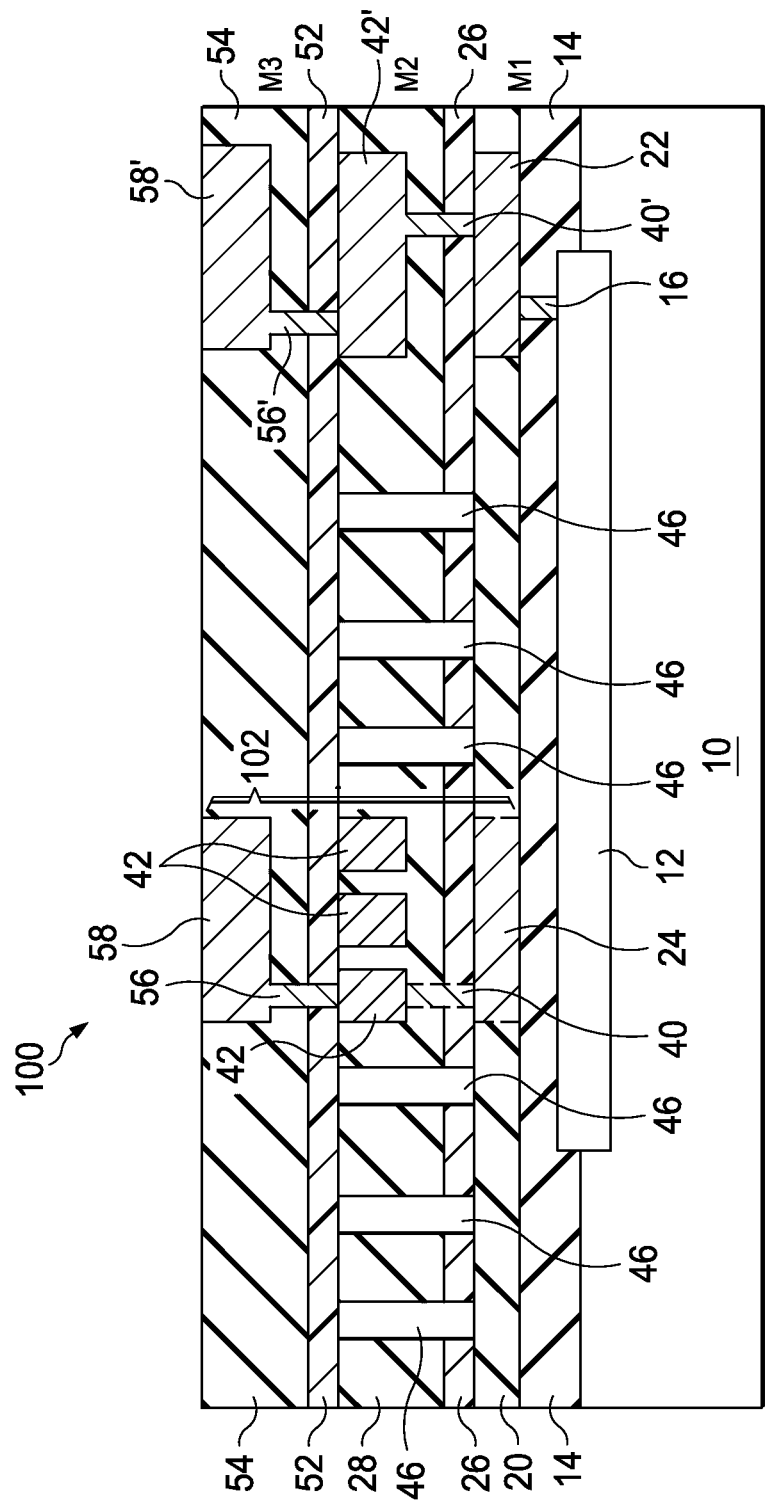

FIG. 8 illustrates the formation of metal layer M3. IMD layer 54 is formed over ESL 52, wherein IMD layer 54 may be formed of a material selected from the same group of available materials for forming IMD layer 28. Next, vias 56 and 56' and metal lines 58 and 58' are formed using a dual damascene process. Metal line 58 and via 56 form parts of passive device 102, and are connected to metal lines 42.

Figure 9:
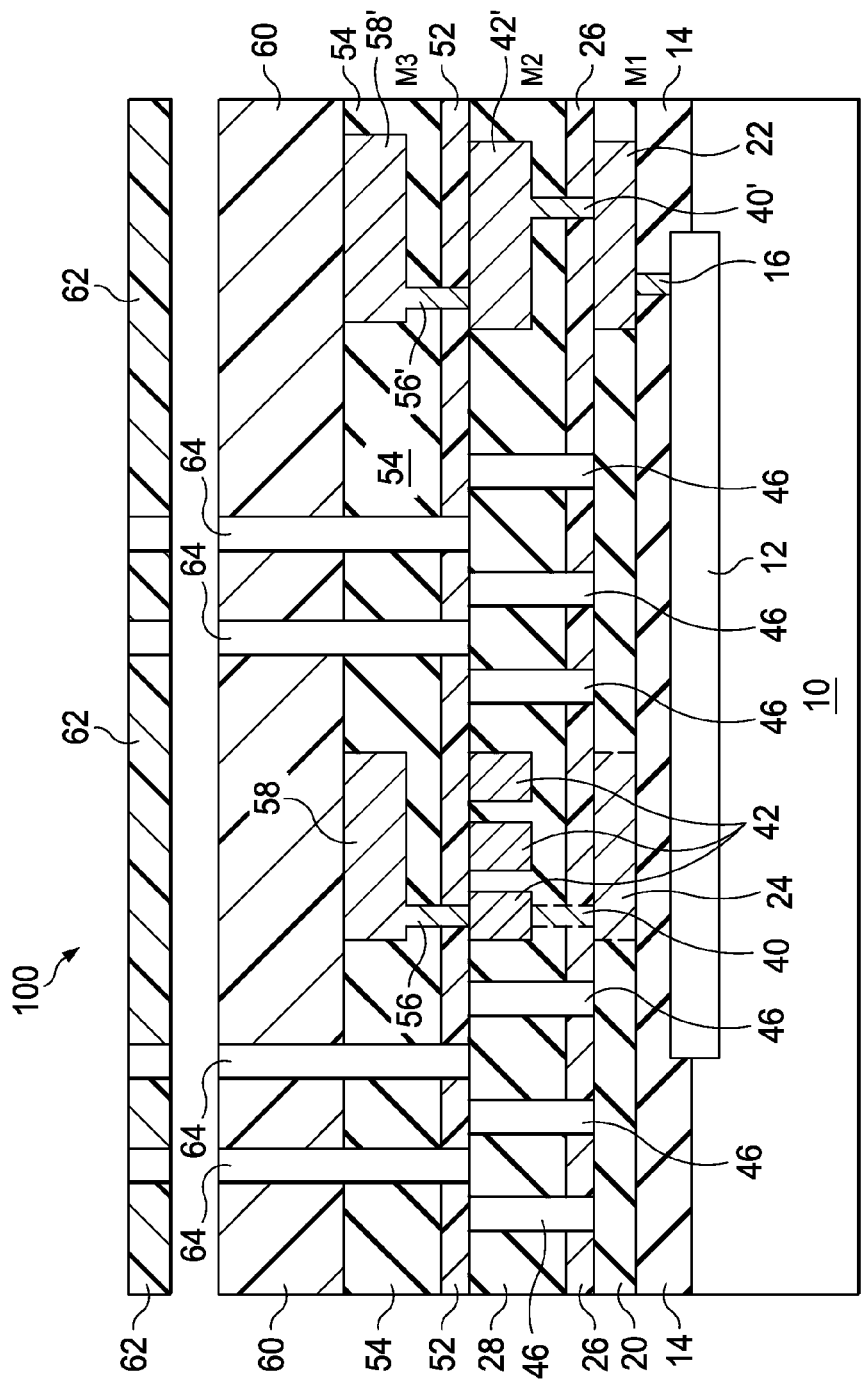

In a subsequent step, as shown in FIG. 9, photo resist 60 is applied and exposed using lithography mask 62. Photo resist 60 is then used as the etching mask to etch IMD layer 54 and ESL 52. The etching process may be essentially the same as the etching of IMD layer 28 and ESL 26. Openings 64 surround passive device 102. In some embodiments, openings 64 are misaligned with voids 46, and openings 64 are not connected to the underlying voids 46. To achieve the misalignment, the patterns of lithography mask 62 are different from that in lithography mask 48 (FIG. 6). In alternative embodiments, openings 64 are aligned to voids 46. To achieve the alignment, the same lithography mask 48 that is used in the step in FIG. 6 is also used as lithography mask 62.

Figure 10:
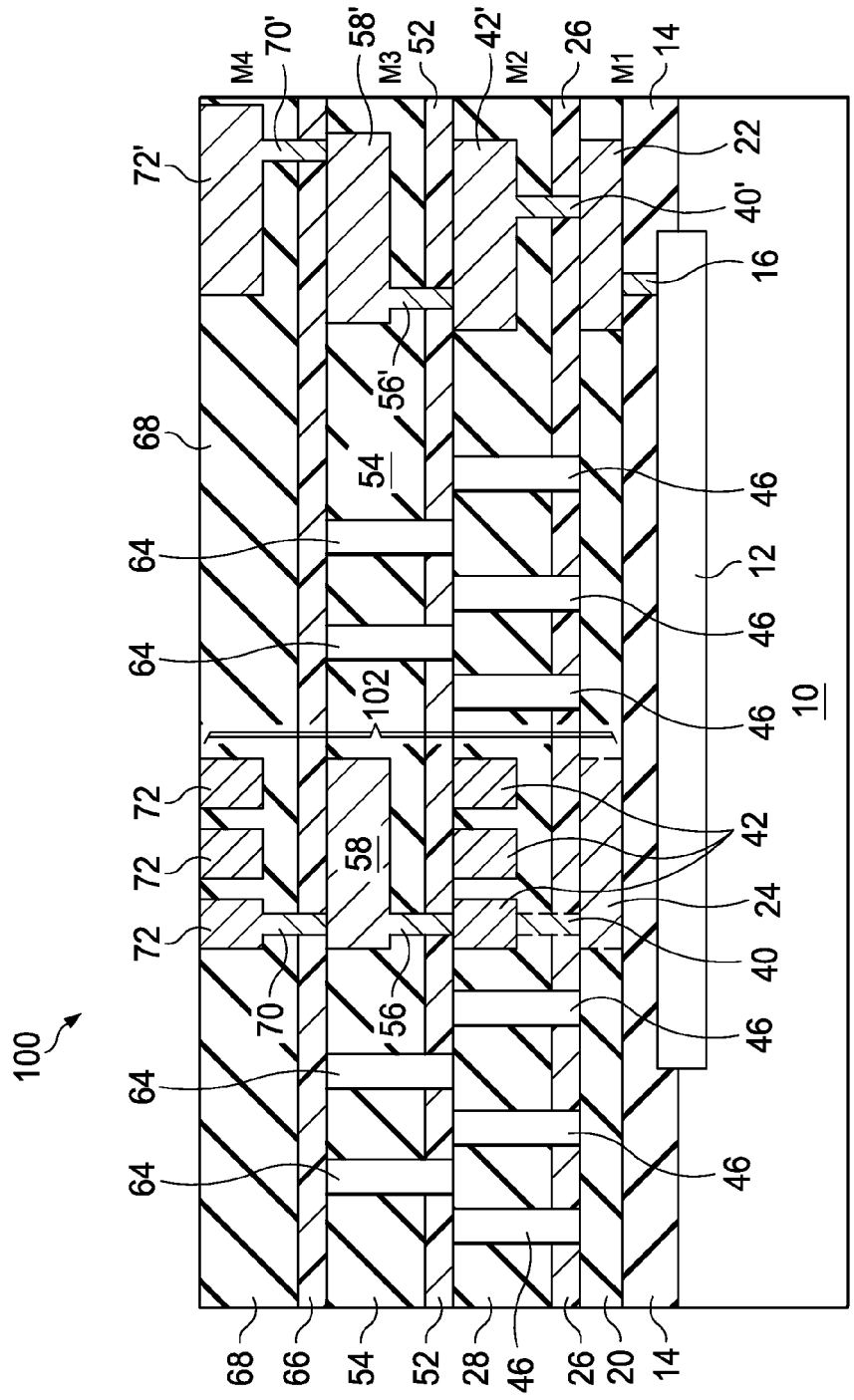

FIG. 10 illustrates the formation of metal layer M4. ESL 66, IMD layer 68, metal lines 72 and 72', and vias 70 and 70' are formed. The formation may use the similar dual damascene process as in FIGS. 3 through 5. Metal line 72 and via 70 may form a further portion of passive device 102. Openings 64 are sealed by ESL 66 to form voids. Next, in FIG. 11, openings 74 are formed using photo resist 76 as an etching mask. The exposure of photo resist 76 may be performed using lithography mask 78, which may be the same lithography mask 48 in FIG. 6. Accordingly, openings 74 may be aligned to the respective underlying voids 46. In alternative embodiments, lithography mask 78 has patterns different from the patterns of both lithography masks 48 (FIGS. 6) and 62 (FIG. 9), and hence openings 74 are misaligned with voids 46 and 64.

Figure 12:
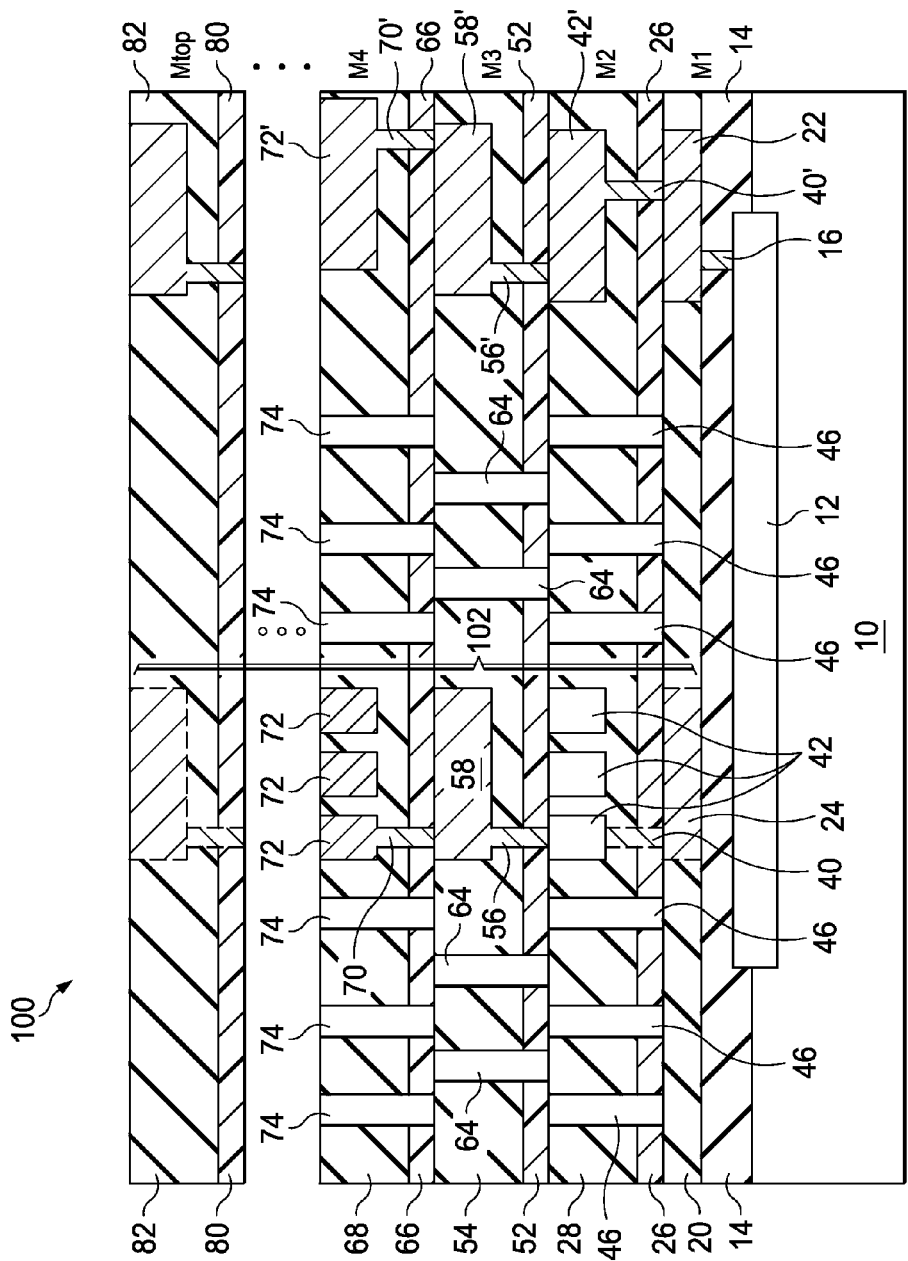

FIG. 12 illustrates the formation of more IMD layers and metal layers over metal layer M4, and the formation of the respective ESLs, the metal lines, and the vias. IMD layer 82 is the top one of the plurality of IMD layers, with metal layer Mtop formed therein. ESL 80 is underlying and in contact with IMD layer 82. IMD layer 82 may also be a low-k dielectric layer. Passive device 102 may extend into IMD layer 82, or may be underlying IMD layer 82.

Figure 11:
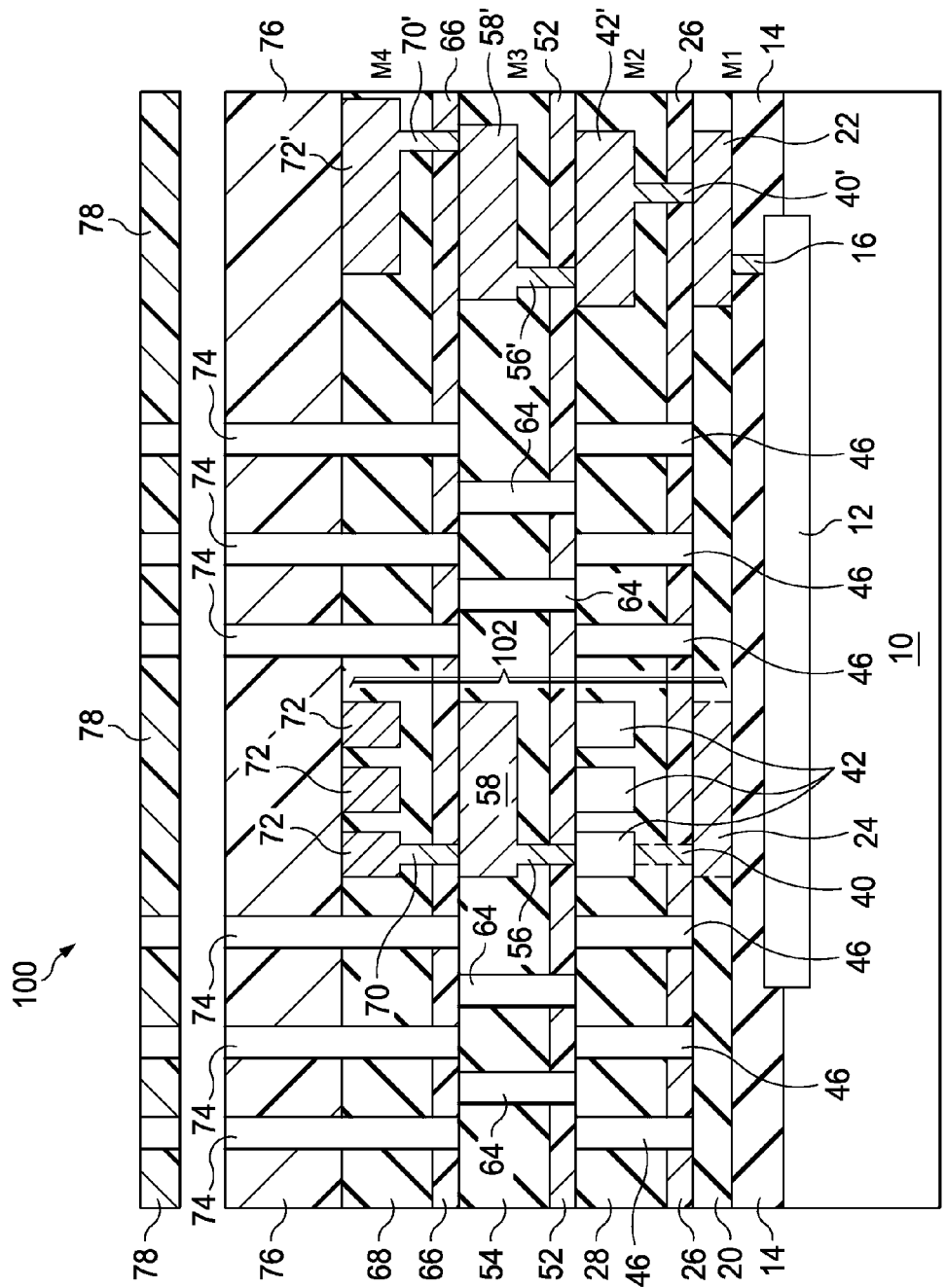
Figure 13:
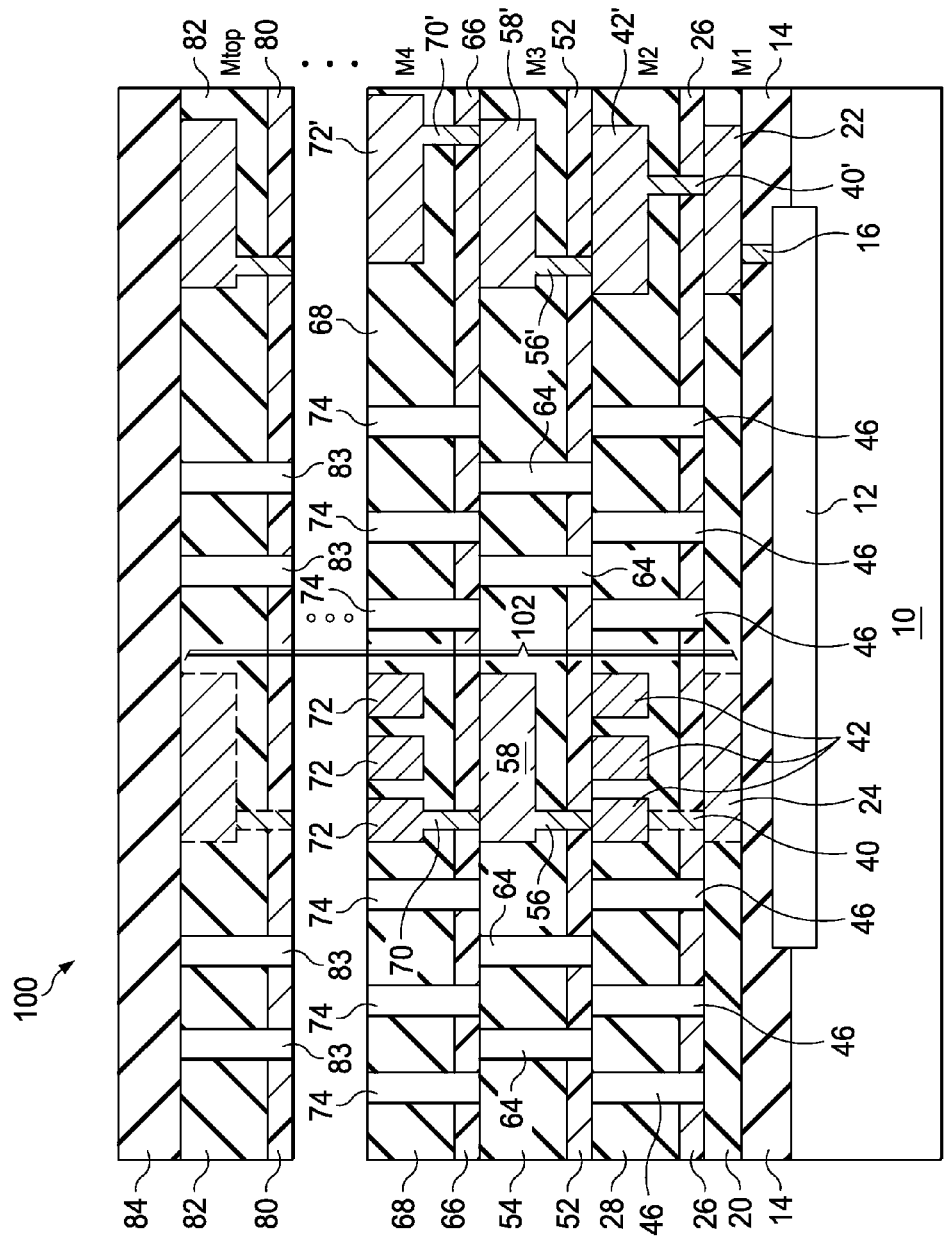

Next, as shown in FIG. 13, voids 83 are formed in IMD layer 82 and ESL 80. The formation of voids 83 may reuse one of the lithography masks such as 48 (FIG. 6), 62 (FIG. 9), or 78 (FIG. 11). Non-low-k dielectric layers 84, which may include passivation layers, are formed over IMD layer 82, and seal voids 83. Non-low-k dielectric layers 84 may have k values close to or greater than about 3.9. Conductive lines (not shown) may be formed in non-low-k dielectric layers 84. In some embodiments, passive device 102 extends into the non-low-k dielectric layers 84. In alternative embodiments, passive device 102 is below non-low-k dielectric layers 84. Voids that surround passive device 102, however, may not extend into non-low-k dielectric layers 84.

Figure 14:
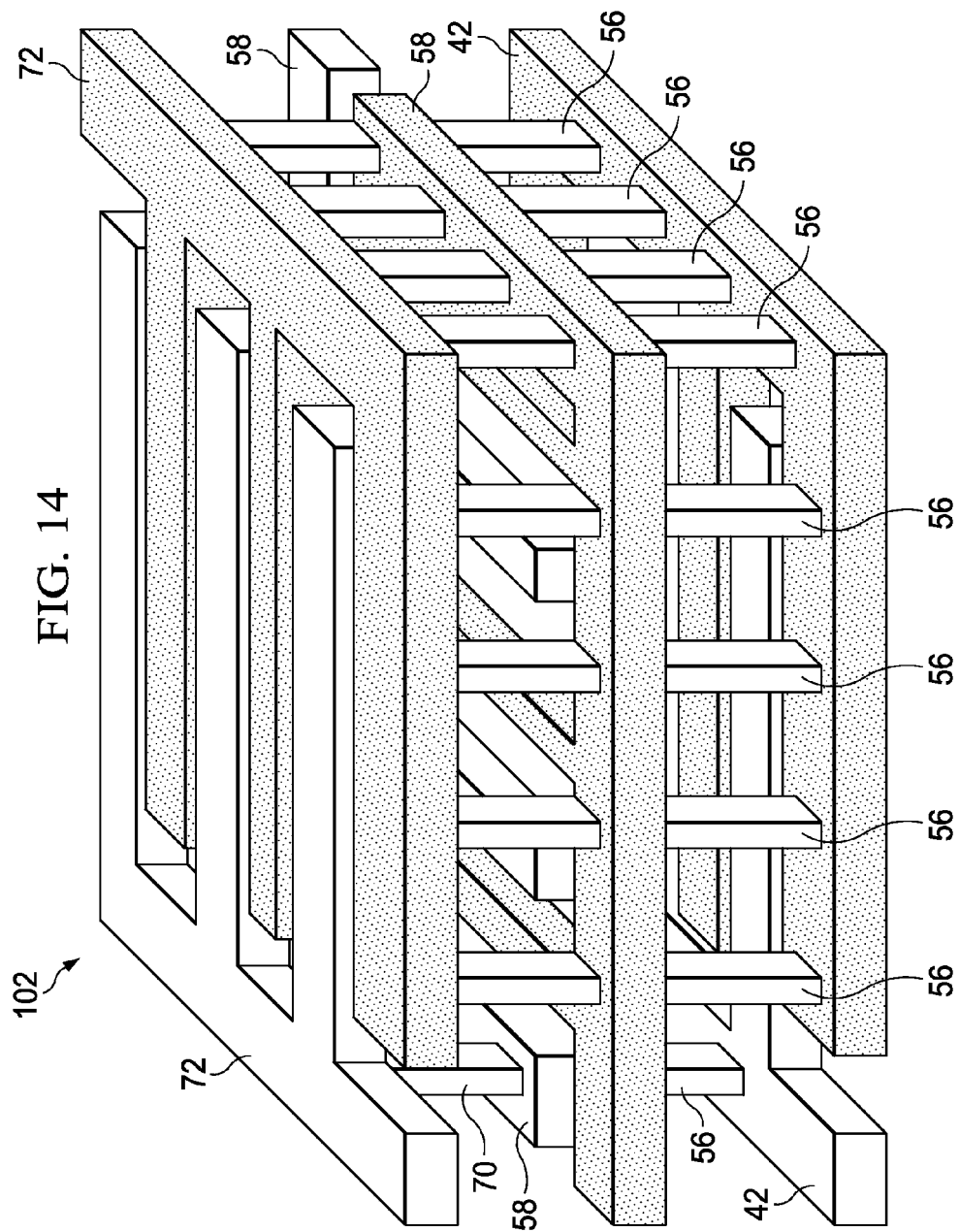
FIG. 14 illustrates a perspective view of an exemplary passive device, which is a Metal-Oxide-Metal (MOM) capacitor.

FIG. 14 illustrates an exemplary passive device 102. In some embodiments, passive device 102 is a Metal-Oxide-Metal (MOM) capacitor. MOM capacitor 102 includes a plurality of buses and fingers connected to the buses, wherein the buses and fingers are the metal lines such as 42, 58, and 72. The buses and fingers may also include vias such as 40 (refer to FIGS. 13), 56, and 70. The bottom layer of MOM capacitor 102 may be in any of IMD layers M1 through Mtop (FIG. 13). The top layer of MOM capacitor 102 may be in any of IMD layers M2 through Mtop, or higher. In alternative embodiments, passive device 102 may be a resistor, a capacitor, an inductor, a transformer, a balun, a micro-stripe, a co-planar waveguide, or the like.

FIG. 15 illustrates a top view of passive device 102 and voids 46, 64, 74, and 83. The regions of IMD layers 28, 54, 68 and/or 82, in which passive device 102 is formed, are denoted as first region 92. Voids 46, 64, 74, and 83 are distributed in a second region 90, which is in the same IMD layers as first region 92, wherein second region 90 encircles first region 92. Furthermore, when viewed in a cross-sectional view, voids 46, 64, 74, and 83 are also formed in third region 94 that overlaps second region 90, and/or a fourth region 96 that is overlapped by the second region 90. For example, referring to FIG. 13, assuming passive device 102 is formed in metal layers M2 and M3, then voids 83 are formed in third region 94, voids 46 are formed in fourth region 96, and voids 64 and 74 are formed in second region 90.

Voids 46, 64, 74, and 83 may be distributed substantially evenly in regions 90, 94, and 96. Voids 46, 64, 74, and 83 may not be formed to overlap, or overlapped by, passive device 102. The spacing between neighboring voids 46, 64, 74, and 83 may be as small as, or greater than, the minimum spacing (allowed by design rules) of neighboring metal lines in the same IMD layer. In some exemplary embodiments, in region 90, there are substantially no conductive features formed except passive device 102 and the electrical connections (not shown) that are used for connecting passive device 102 to the circuits in wafer 100.

In the embodiments, by forming voids encircling passive devices, the effective k value of the dielectric material that is located between the passive devices and neighboring metal features is reduced. Accordingly, the performance of the passive devices is affected less by the neighboring conductive features. This is particularly helpful when the passive device is operated under the radio frequency.

In accordance with embodiments, a device includes a dielectric layer, a passive device including a portion in the dielectric layer, and a plurality of voids in the dielectric layer and encircling the passive device.

In accordance with other embodiments, a device includes a semiconductor substrate, a plurality of low-k dielectric layers over the semiconductor substrate, and a non-low-k dielectric layer over the plurality of low-k dielectric layers. A passive device includes a portion in a first region of a first one of the plurality of low-k dielectric layers, wherein the passive device includes a metal line and a via underlying and joined to the metal line. A plurality of voids is distributed in a second region of the first one of the plurality of low-k dielectric layers. The second region encircles the first region. A first portion of the plurality of voids is level with the metal line, and a second portion of the plurality of voids is level with the via.

In accordance with yet other embodiments, a method includes forming a first etch stop layer over a semiconductor substrate, forming a first low-k dielectric layer over the first etch stop layer, and forming a first portion of a passive device in the first low-k dielectric layer. After the step of forming the first portion of the passive device, the first low-k dielectric layer is etched to form a first plurality of openings in the first low-k dielectric layer. A second etch stop layer is formed over the first low-k dielectric layer, wherein the first plurality of openings remains after the second etch stop layer is formed. A second low-k dielectric layer is formed over the second etch stop layer. The second low-k dielectric layer is etched to form a second plurality of openings in the second low-k dielectric layer. An upper dielectric layer is formed over the second low-k dielectric layer, wherein the second plurality of openings remains after the upper dielectric layer is formed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a dielectric layer;
a passive device comprising a portion in the dielectric layer, wherein the passive device comprises a Metal-Oxide-Metal (MOM) capacitor, a resistor, an inductor, a transformer, a balun, a micro-stripe, or a co-planar waveguide;
a plurality of voids in the dielectric layer and encircling the passive device;
a plurality of low-k dielectric layers overlying the dielectric layer; and
a non-low-k dielectric layer over the plurality of low-k dielectric layers, wherein additional voids are formed in the plurality of low-k dielectric layers and surrounding the passive device.

2. The device of claim 1, wherein the dielectric layer is a low-k dielectric layer, wherein the device further comprises an etch stop layer underlying the dielectric layer, and wherein the plurality of voids extends into the etch stop layer.

3. The device of claim 1, wherein the dielectric layer is a low-k dielectric layer, wherein the device further comprises an etch stop layer overlying and contacting the dielectric layer, and wherein tops of the plurality of voids are lower than a bottom surface of the etch stop layer.

4. The device of claim 1, wherein no voids are formed in a bottom metal layer and surrounding the passive device, and wherein the bottom metal layer is in a bottom low-k dielectric layer of a chip that comprises the dielectric layer.

5. The device of claim 1, wherein no voids are formed in the non-low-k dielectric layer and surrounding the passive device.

6. The device of claim 1 further comprising:
an additional dielectric layer over the dielectric layer, wherein the passive device extends into the additional dielectric layer; and
additional voids in the additional dielectric layer and encircling the passive device, wherein the additional voids are misaligned with the plurality of voids.

7. The device of claim 1, wherein the passive device comprises the inductor, the transformer, the balun, the micro-stripe, or the co-planar waveguide.

8. A device comprising:
a semiconductor substrate;
a plurality of low-k dielectric layers over the semiconductor substrate, wherein voids are formed in each of the plurality of low-k dielectric layers that is higher than a bottom metal layer of a chip that comprises the semiconductor substrate;
a non-low-k dielectric layer over the plurality of low-k dielectric layers; and
a passive device comprising a portion in a first region of a first one of the plurality of low-k dielectric layers, wherein the passive device comprises a metal line and a via underlying and joined to the metal line, wherein the passive device comprises a Metal-Oxide-Metal (MOM) capacitor, a resistor, an inductor, a transformer, a balun, a micro-stripe, or a co-planar waveguide, wherein a plurality of the voids are distributed in a second region of the first one of the plurality of low-k dielectric layers, wherein the second region encircles the first region, and wherein a first portion of the plurality of the voids is level with the metal line, and a second portion of the plurality of the voids is level with the via.

9. The device of claim 8 further comprising an etch stop layer underlying and contacting the first one of the plurality of low-k dielectric layers, and each of the plurality of the voids comprises:
a top substantially level with a top surface of the first one of the plurality of low-k dielectric layers; and
a bottom substantially level with a top surface of the etch stop layer.

10. The device of claim 8, wherein the passive device extends into a second one of the plurality of low-k dielectric layers, and is below a third one of the plurality of low-k dielectric layers, and wherein an additional plurality of the voids are disposed in a third region of the third one of the plurality of low-k dielectric layers, and wherein the third region overlaps the second region and forms a ring.

11. The device of claim 8, wherein substantially no void is disposed in a third region of the non-low-k dielectric layer, and wherein the third region overlaps the second region and forms a ring.

12. The device of claim 8, wherein the passive device is selected from the group consisting essentially of a capacitor, an inductor, and a transformer.

13. The device of claim 8, wherein the passive device comprises the inductor, the transformer, the balun, the microstripe, or the co-planar waveguide.

14. A method comprising:
- forming a first etch stop layer over a semiconductor substrate;
- forming a first low-k dielectric layer over the first etch stop layer;
- forming a first portion of a passive device in the first low-k dielectric layer;
- after the step of forming the first portion of the passive device, etching the first low-k dielectric layer to form a first plurality of openings in the first low-k dielectric layer;
- forming a second etch stop layer over the first low-k dielectric layer, wherein the first plurality of openings remains after the second etch stop layer is formed;
- forming a second low-k dielectric layer over the second etch stop layer;
- etching the second low-k dielectric layer to form a second plurality of openings in the second low-k dielectric layer; and
- forming an upper dielectric layer over the second low-k dielectric layer, wherein the second plurality of openings remains after the upper dielectric layer is formed.

15. The method of claim 14, wherein the step of etching the first low-k dielectric layer is performed using a first lithography mask, wherein the step of etching the second low-k dielectric layer is performed using a second lithography mask, and wherein the first lithography mask and the second lithography mask have different patterns.

16. The method of claim 14 further comprising, after the step of etching the first low-k dielectric layer to form the first plurality of openings in the first low-k dielectric layer, changing a first etching gas for etching the first low-k dielectric layer to a second etching gas, and etching the first etch stop layer using the second etching gas to extend the first plurality of openings into the first etch stop layer.

17. The method of claim 15 further comprising:
- forming a third etch stop layer over the second low-k dielectric layer;
- forming a third low-k dielectric layer over the third etch stop layer; and
- etching the third low-k dielectric layer to form a third plurality of openings in the third low-k dielectric layer, wherein the step of etching the third low-k dielectric layer is performed using the first lithography mask.

18. The method of claim 17, wherein the passive device is below the third low-k dielectric layer.

19. The method of claim 16, wherein the step of etching the first etch stop layer is performed using a dielectric layer underlying the first etch stop layer as an etch stop layer.

20. The method of claim 16 comprising:
- forming a plurality of low-k dielectric layers comprising at least three low-k dielectric layers; and
- etching each of the plurality of low-k dielectric layers to form openings, wherein opening in neighboring ones of the plurality of low-k dielectric layers are formed using different lithography masks, and wherein at least two lithography masks are used for etching the plurality of low-k dielectric layers.

* * * * *